US010504918B2

(12) United States Patent
Shimojo et al.

(10) Patent No.: US 10,504,918 B2
(45) Date of Patent: Dec. 10, 2019

(54) MEMORY DEVICE

(71) Applicant: Toshiba Memory Corporation, Minato-ku (JP)

(72) Inventors: Yoshiro Shimojo, Yokohama (JP); Masahisa Sonoda, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/044,775

(22) Filed: Jul. 25, 2018

(65) Prior Publication Data

US 2019/0287985 A1 Sep. 19, 2019

Related U.S. Application Data

(60) Provisional application No. 62/643,876, filed on Mar. 16, 2018.

(51) Int. Cl.
*H01L 27/115* (2017.01)
*H01L 23/528* (2006.01)
(Continued)

(52) U.S. Cl.
CPC ......... *H01L 27/11582* (2013.01); *G11C 8/14* (2013.01); *H01L 23/5226* (2013.01); *H01L 27/1157* (2013.01)

(58) Field of Classification Search
CPC ........ H01L 27/11582; H01L 27/11565; H01L 29/7926; H01L 29/66833; H01L 29/66969; H01L 21/76877; H01L 21/30604; H01L 21/469; H01L 21/465; H01L 21/31; H01L 21/47573; H01L 21/31116; H01L 23/528; H01L 29/78; H01L 29/1095; H01L 29/7395; H01L 29/086; H01L 29/408; H01L 29/0696; H01L 29/0634; H01L 29/402; H01L 29/42376; H01L 29/0619; H01L 29/40; H01L 29/06; H01L 29/10; (Continued)

(56) References Cited

U.S. PATENT DOCUMENTS 8,044,448 B2 * 10/2011 Kamigaichi ........... G11O 5/025
257/296
9,761,606 B1    9/2017 Ishida et al.
(Continued)

*Primary Examiner* — Natalia A Gondarenko
(74) *Attorney, Agent, or Firm* — Oblon, McClelland, Maier & Neustadt, L.L.P.

(57) ABSTRACT

A memory device includes a memory region, a connection region, an interconnection layer and a circuit. The memory region includes electrode layers and semiconductor layers. The electrode layers are stacked in a first direction, and the semiconductor layers extend in the first direction through the electrode layers. The connection region is surrounded with the memory region, and includes an insulating body and contact plugs. The insulating body has a thickness in the first direction thicker than a stacked width in the first direction of the electrode layers, and the contact plugs extending in the first direction through the insulating body. The interconnection layer includes interconnections electrically connected respectively to the electrode layers and some of the semiconductor layers. The electrode layers and the insulating body are positioned between the circuit and the interconnection layer in the first direction.

18 Claims, 17 Drawing Sheets

(51) Int. Cl.
  *H01L 27/1157*   (2017.01)
  *H01L 27/11582*  (2017.01)
  *H01L 23/522*    (2006.01)
  *H01L 27/11573*  (2017.01)
  *G11C 8/14*      (2006.01)

(58) Field of Classification Search
  CPC ..... H01L 29/08; H01L 29/739; H01L 29/423;
              H01L 29/66712–66734; H01L
              29/7802–7815; H01L 29/66666; H01L
              29/7827–7828; H01L 29/78642; H01L
              27/085–098; H01L 27/0922; H01L
              27/105; H01L 27/11526; H01L 27/11546;
              H01L 21/8232–8239; H01L 21/823462;
              H01L 21/823842; H01L 21/823857;
              H01L 21/823487; H01L 2924/1434;
              H01L 2924/1443; H01L 2924/1436;
              H01L 2924/1438; H01L 2924/145; H01L
              2924/14511; H01L 2924/1453; H01L
              27/1157; H01L 23/5226; G11C 8/14
  USPC ....... 257/324, 315, 316, 43, 5; 438/104, 241
  See application file for complete search history.

(56) References Cited

U.S. PATENT DOCUMENTS

| | | | |
|---|---|---|---|
| 9,780,105 B2 | 10/2017 | Yamada | |
| 2016/0372482 A1* | 12/2016 | Zhang | ............... H01L 27/11529 |
| 2017/0077131 A1 | 3/2017 | Konagai et al. | |
| 2017/0263618 A1 | 9/2017 | Shimojo | |
| 2017/0301690 A1* | 10/2017 | Chae | ................ H01L 27/11578 |

\* cited by examiner

MEMORY DEVICE

CROSS-REFERENCE TO RELATED APPLICATIONS

This application is based upon and claims the benefit of priority from U.S. Provisional Patent Application 62/643,876 filed on Mar. 16, 2018; the entire contents of which are incorporated herein by reference.

FIELD

Embodiments relate to a memory device.

BACKGROUND

In a memory device including three-dimensionally arranged memory cells, the memory capacity can be increased by reducing the surface area of the connection region provided for connecting the memory cells to a drive circuit and by enlarging the memory region where the memory cells are disposed.

DETAILED DESCRIPTION

Figure 1:
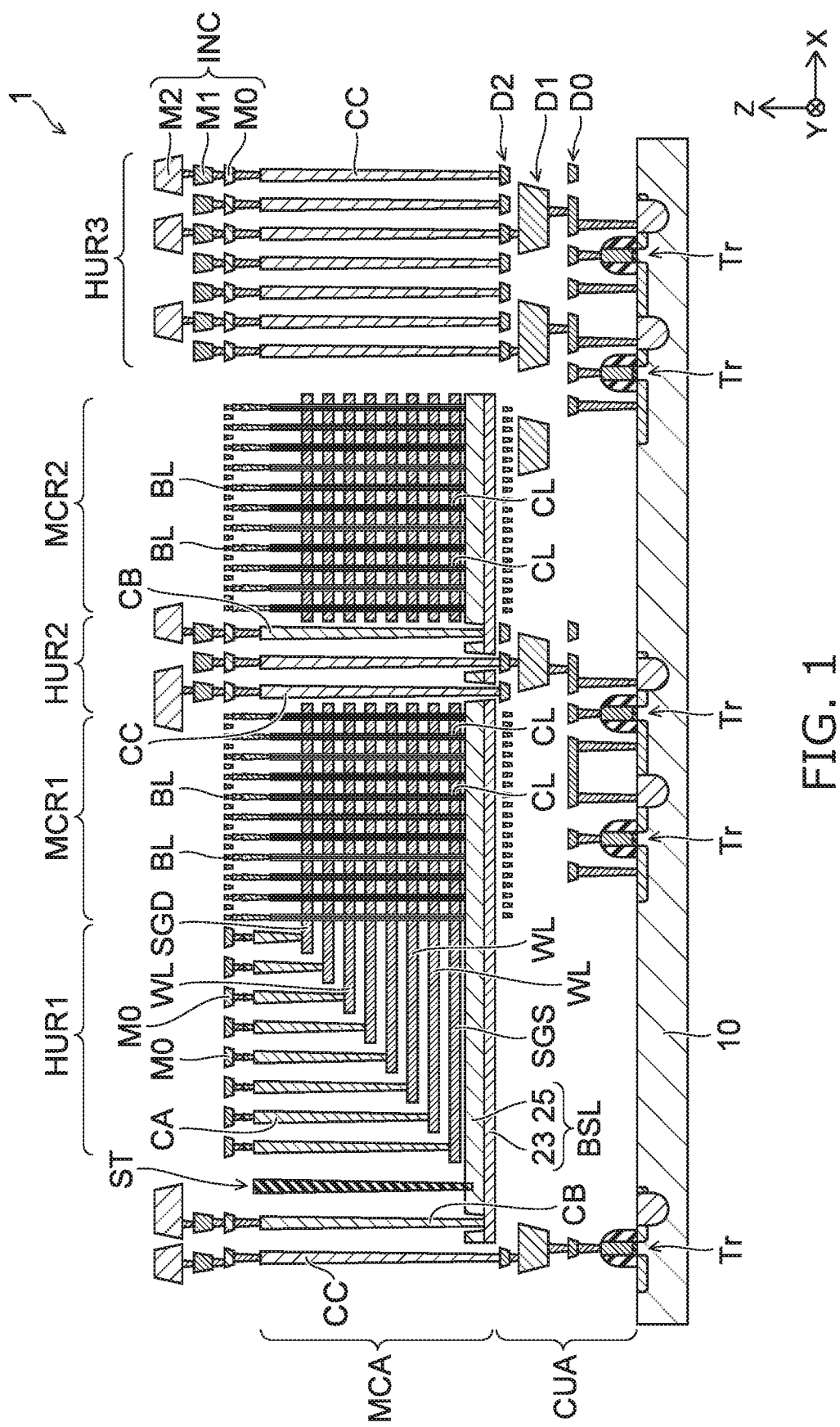
FIG. 1 is a schematic cross-sectional view showing a memory device according to a first embodiment.

According to one embodiment, a memory device includes a memory region, a connection region, an interconnection layer and a circuit. The memory region includes a plurality of electrode layers and semiconductor layers, the plurality of electrode layers being stacked in a first direction, and the semiconductor layers extending in the first direction through the plurality of electrode layers. The connection region is surrounded with the memory region, the connection region including an insulating body and a plurality of contact plugs, the insulating body having a thickness in the first direction thicker than a stacked width in the first direction of the plurality of electrode layers, and the plurality of contact plugs extending in the first direction through the insulating body. The interconnection layer includes interconnections electrically connected respectively to the plurality of electrode layers and some of the semiconductor layers. The circuit is electrically connected to a first interconnection included in the interconnection layer, the circuit being electrically connected via one of the plurality of contact plugs to the first interconnection. The plurality of electrode layers and the insulating body are positioned between the circuit and the interconnection layer in the first direction.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 2:
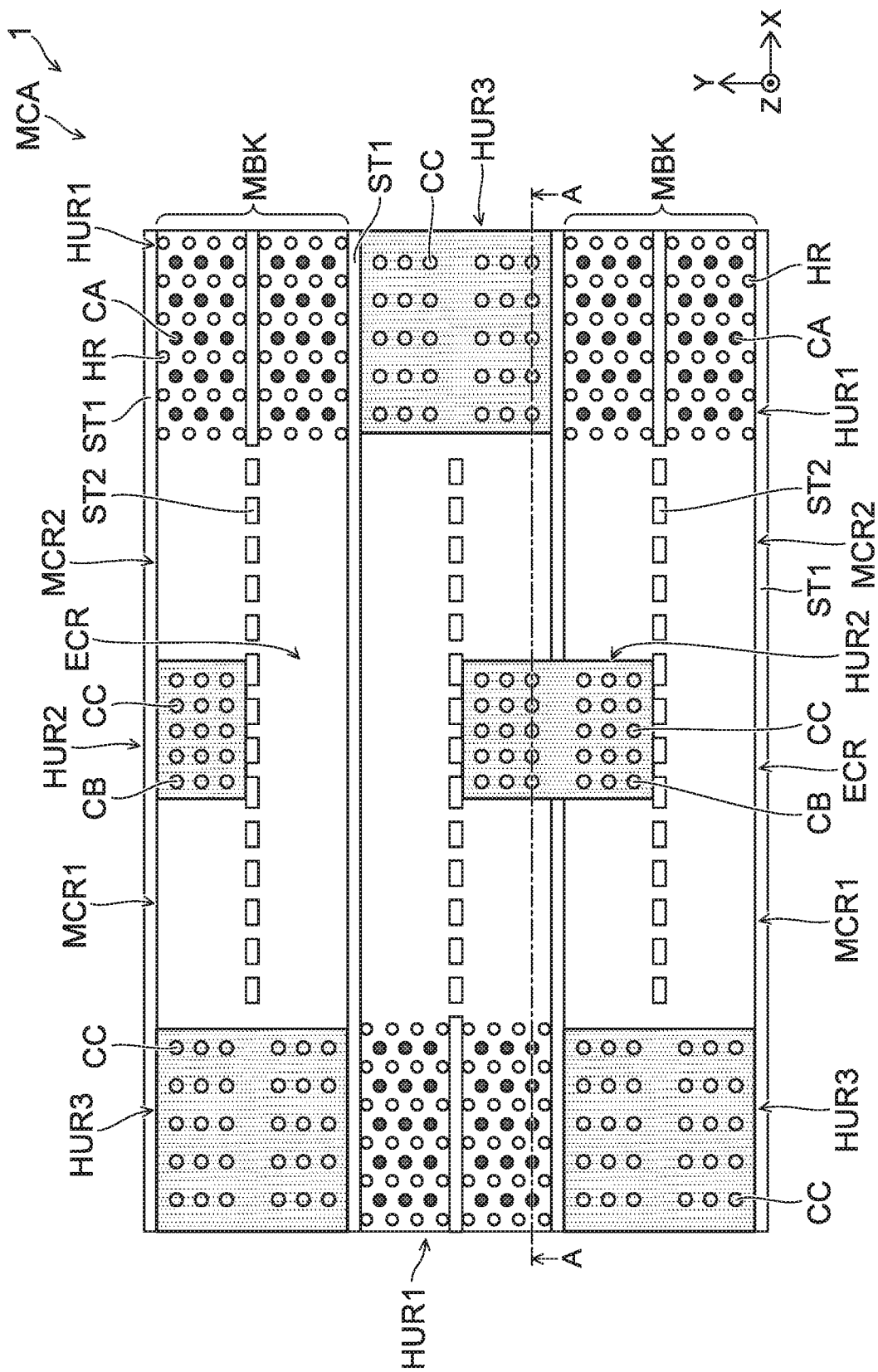
FIG. 2 is a schematic plan view showing the memory device according to the first embodiment.

FIG. 1 and FIG. 2 are schematic views showing a memory device 1 according to a first embodiment. FIG. 1 is a cross-sectional view along line A-A shown in FIG. 2; and FIG. 2 is a plan view showing an arrangement of the regions included in the memory device 1. Note that insulating films are not illustrated in FIG. 1, which electrically insulate between the illustrated components.

The memory device 1 is, for example, a NAND type nonvolatile memory device and includes a circuit CUA provided on a substrate 10, a memory cell array MCA provided above the circuit CUA, and a multilayer interconnection INC provided above the memory cell array MCA.

The substrate 10 is, for example, a silicon substrate. The circuit CUA includes a transistor Tr provided in the surface layer of the substrate 10, and interconnections D0, D1, and D2 provided above the substrate 10. The multilayer interconnection INC that includes interconnections M0, M1, and M2 is provided above the memory cell array MCA.

As shown in FIG. 1, the memory cell array MCA includes a memory cell region MCR and hook-up regions (vertical connection regions) HUR1, HUR2 and HUR3. In the description hereinbelow, there are cases where the hook-up regions HUR1, HUR2 and HUR3 are described individually and cases where the hook-up regions HUR1, HUR2 and HUR3 are generally referred to and described as the hook-up region HUR. The other components also are described similarly.

Figure 3B:
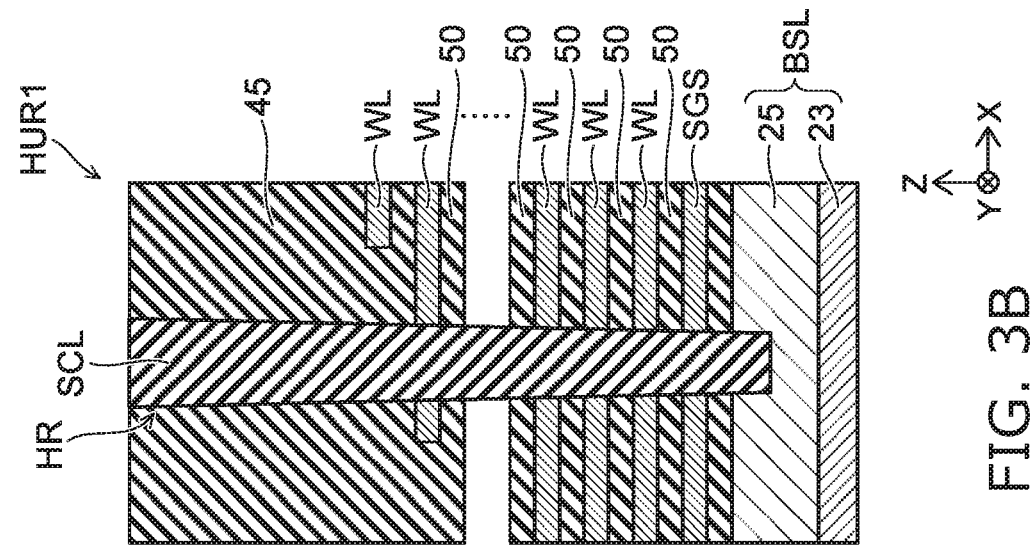
FIGS. 3A and 3B are schematic partial cross-sectional views showing the memory device according to the first embodiment.
Figure 3A:
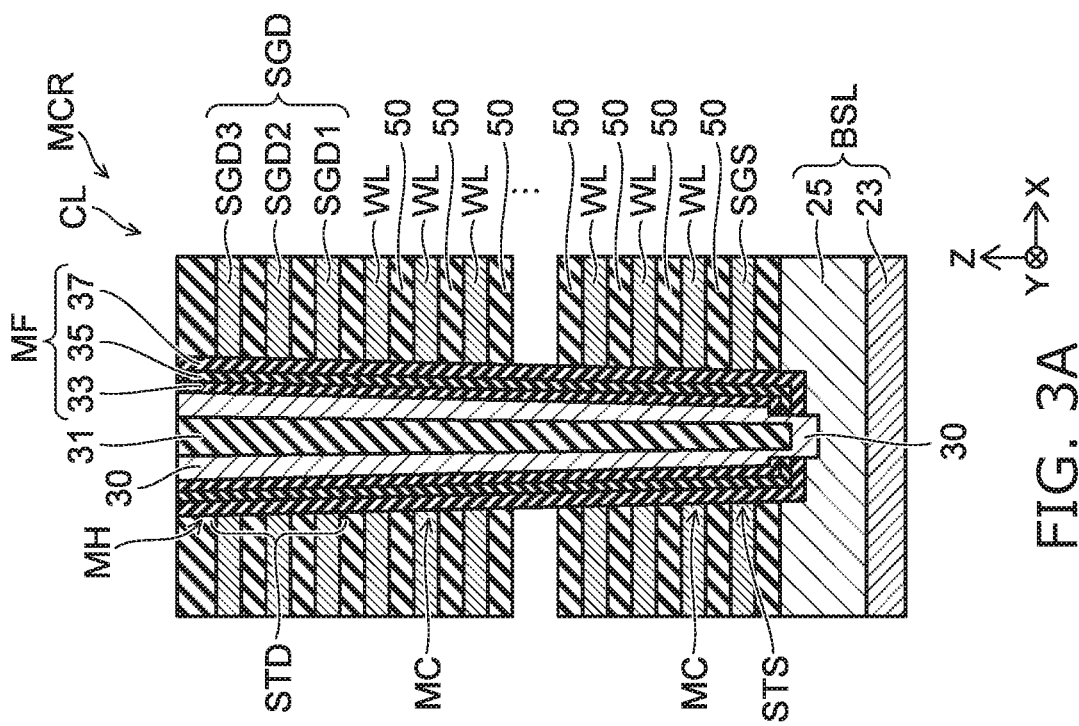

The memory cell region MCR includes memory cells MC that are three-dimensionally arranged (referring to FIG. 3A). The hook-up region HUR includes contact plugs CA and CB that electrically connect the components of the memory cell array MCA respectively to the interconnections of the multilayer interconnection INC. The hook-up region HUR also includes contact plugs CC that electrically connect the interconnections of the circuit CUA to other interconnections of the multilayer interconnection INC.

The memory cell array MCA includes a source line BSL and multiple electrode layers (hereinbelow, a select gate SGS, word lines WL, and a select gate SGD). The select gate SGS, the word lines WL, and the select gate SGD are stacked in order above the source line BSL.

The memory cell region MCR includes columnar bodies CL extending through the select gate SGS, the word lines WL, and the select gate SGD in the stacking direction of the select gate SGS, the word lines WL, and the select gate SGD (i.e., a Z-direction). The columnar bodies CL extend in the Z-direction and include semiconductor layers electrically connected to the source line BSL and the interconnections M0 (e.g., bit lines BL), respectively. The memory cells MC are provided at portions where the columnar bodies CL cross the word lines WL (referring to FIG. 3A).

The hook-up region HUR1 includes the contact plugs CA and the end portions of the select gate SGS, the word lines WL, and the select gate SGD. The end portions of the word lines WL and the select gate SGD are provided in a staircase configuration; and the contact plugs CA extend through a insulating film (not-illustrated) in the Z-direction, and are connected to the end portions of the select gate SGS, the word lines WL, and the select gate SGD. For example, the contact plugs CA connect the select gate SGS, the word lines WL, and the select gate SGD respectively to the interconnections M0 of the upper layer.

The hook-up region HUR2 is provided at a portion surrounded with the memory cell region MCR. The hook-up region HUR2 includes multiple contact plugs CB and CC, and an insulating body (not-illustrated) that is surrounded with the stacked body of the select gate SGS, the word lines WL, and the select gate SGD (referring to FIG. 8). The contact plugs CB and CC extend in the Z-direction through the insulating body. The contact plug CB electrically connects the source line BSL to the interconnection M2. Also, for example, the contact plug CC electrically connects the interconnection D2 of the circuit CUA to an interconnection M1 or M2.

In the memory cell array MCA, the hook-up region HUR3 is provided at the end on the side opposite to the hook-up region HUR1. The memory cell region MCR and the hook-up region HUR2 are provided between the hook-up region HUR1 and the hook-up region HUR3.

The hook-up region HUR3 includes a not-illustrated insulating body (referring to FIG. 8) and the multiple contact plugs CC that extend in the Z-direction through the not-illustrated insulating body. For example, the contact plug CC electrically connects the interconnection D2 of the circuit CUA to an interconnection M1 or M2.

The contact plugs CA, CB, and CC include, for example, a metal. The source line BSL has a stacked structure including, for example, a metal layer 23 and a semiconductor layer 25; and the contact plug CB is connected to the metal layer 23.

FIG. 2 is a schematic plan view showing the memory cell array MCA of the memory device 1 according to the first embodiment. FIG. 2 is a plan view schematically showing the planar arrangement of the memory cell region MCR and the hook-up regions HUR1, HUR2 and HUR3. The surface areas of the regions shown in FIG. 2 are examples and are not limited thereto.

As shown in FIG. 2, the memory cell array MCA includes multiple memory blocks MBK arranged in a Y-direction. The hook-up region HUR1 is disposed at one end of one memory block in an X-direction; and the hook-up region HUR3 is disposed at the other end. For example, the hook-up regions HUR1 and HUR3 are disposed to be arranged alternately in the Y-direction.

The memory cell region MCR includes a first memory cell region MCR1, a second memory cell region MCR2, and a connection region ECR. The connection region ECR is provided between the first memory cell region MCR1 and the second memory cell region MCR2 in the X-direction. For example, a portion of a word line WL provided in the connection region ECR electrically connects a portion of the word line WL provided in the first memory cell region MCR1 and a portion of the word line WL provided in the second memory cell region MCR2.

For example, the hook-up region HUR2 is provided at a position surrounded with the memory cell regions MCR of adjacent memory blocks MBK. The hook-up region HUR2 is positioned between the first memory cell region MCR1 and the second memory cell region MCR2 in the X-direction, and is positioned between connection regions ECR adjacent to each other in the Y-direction.

A slit ST1 is provided between the memory blocks MBK adjacent to each other in the Y-direction. The slit ST1 is, for example, a trench that extends in the X-direction, and is provided to divide the select gate SGD, the word lines WL, and the select gate SGS.

Slits ST2 are provided respectively in the memory blocks MBK. For example, a slit ST2 is provided along the X-direction at the center of a memory block MBK. The slit ST2 has a depth from a level above the word lines WL to the source line BSL and is provided to be discontinuous so that the slit ST2 does not divide the word lines WL.

Also, the slit ST2 includes a portion positioned between the hook-up region HUR2 and the connection region ECR. The slit ST2 may include, for example, a portion extending to be continuous in the X-direction between the hook-up region HUR2 and the connection region ECR.

FIGS. 3A and 3B are schematic partial cross-sectional views showing the memory device 1 according to the first embodiment. FIG. 3A is a schematic view showing a cross section of the columnar body CL disposed in the memory cell region MCR. FIG. 3B is a schematic view showing a cross section of a columnar support body SCL disposed in the hook-up region HUR1.

As shown in FIG. 3A, the columnar body CL is provided in a memory hole MH. For example, the memory hole MH extends through the select gate SGD, the word lines WL, and the select gate SGS, and is provided to have a depth to the source line BSL.

The columnar body CL includes a memory film MF, a semiconductor layer 30, and an insulating core 31. The memory film MF is provided to cover the inner wall of the memory hole MH and includes, for example, a tunneling insulating film 33, a charge retaining film 35, and a blocking insulating film 37. The insulating core 31 extends along the extension direction of the memory hole MH (i.e., the Z-direction) in the memory hole MH.

The semiconductor layer 30 is provided to surround the insulating core 31, and includes a portion positioned between the memory film MF and the insulating core 31. Also, the semiconductor layer 30 is provided to contact the semiconductor layer 25 of the source line BSL at the bottom end of the semiconductor layer 30.

For example, the tunneling insulating film 33, the charge retaining film 35, and the blocking insulating film 37 are stacked on the inner wall of the memory hole MH. The tunneling insulating film 33 is positioned between the semiconductor layer 30 and the charge retaining film 35; and the blocking insulating film 37 is positioned between the charge retaining film 35 and the word lines WL. The tunneling insulating film 33 and the blocking insulating film 37 are, for example, silicon oxide films; and the charge retaining film 35 is, for example, a silicon nitride film.

The memory cells MC are provided at portions where the columnar body CL crosses the word lines WL. The semiconductor layer 30 acts as a channel of the memory cells MC; and the word lines WL act as control gates of the memory cells MC. Portions of the memory film MF positioned between the semiconductor layer 30 and the word lines WL act as memory portions of the memory cells MC.

A source-side select transistor STS is provided at a portion where the columnar body CL crosses the select gate SGS. Also, a drain-side select transistor STD is provided at a portion where the columnar body CL crosses the select gate SGD. The select gate SGD includes at least one electrode layer. The select gate SGD includes, for example, select gates SGD1, SGD2, and SGD3 stacked in the Z-direction.

As shown in FIG. 3B, the columnar support body SCL is provided in a support hole HR. For example, the support hole HR extends in the Z-direction through at least one electrode layer. For example, the support hole HR is formed to have a depth from a level above the select gate SGD to the source line BSL. The columnar support body SCL is an insulating body, e.g., silicon oxide filling the support hole HR.

A method for manufacturing the memory device 1 according to the first embodiment will now be described with reference to FIG. 4 to FIG. 13. FIG. 4 to FIG. 13 are schematic cross-sectional views showing manufacturing processes of the memory device 1 in order.

Figure 4:
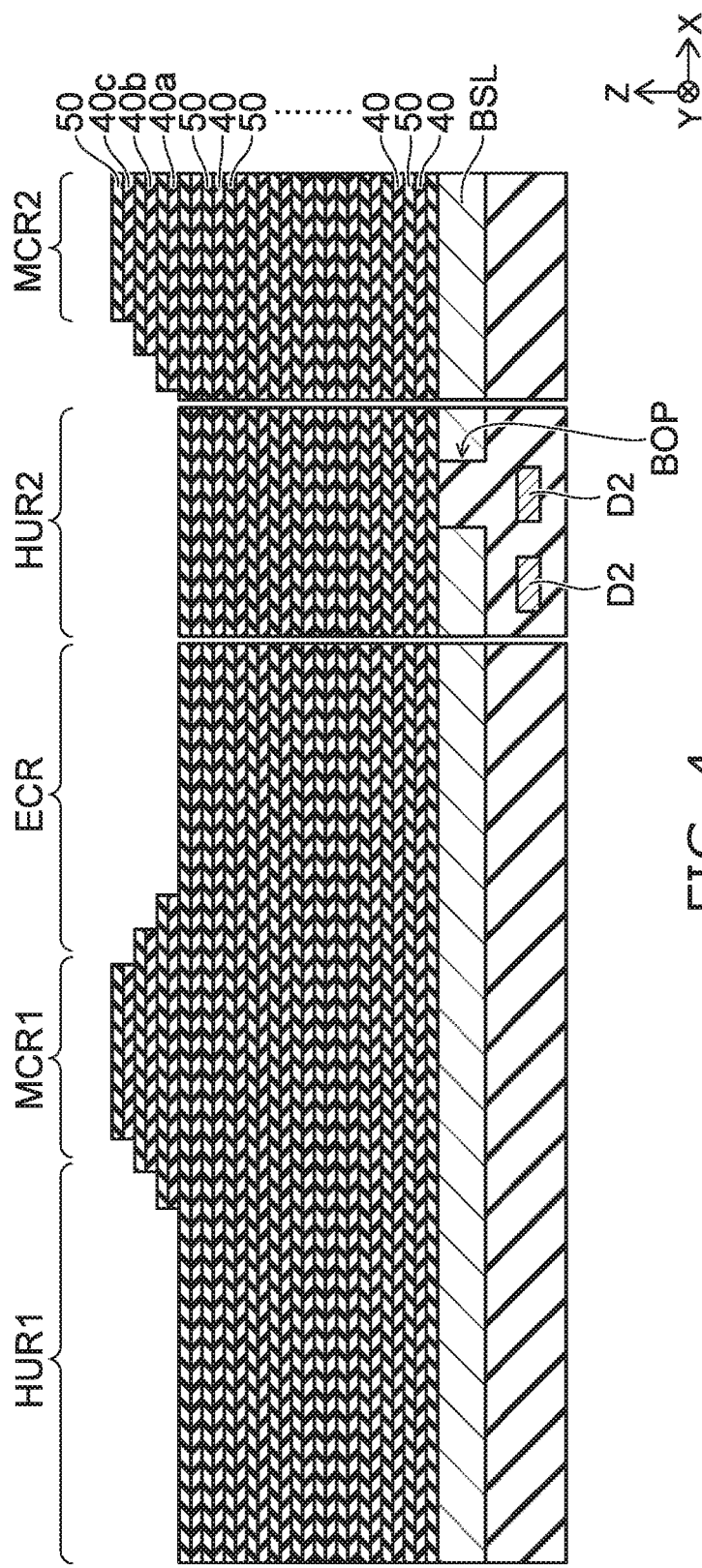
FIG. 4 to FIG. 13 are schematic cross-sectional views showing manufacturing processes of the memory device according to the first embodiment.

As shown in FIG. 4, the source line BSL is formed on the circuit CUA (referring to FIG. 1); subsequently, sacrificial films 40 and insulating films 50 are stacked alternately above the source line BSL. The sacrificial films 40 are, for example, silicon nitride films; and the insulating films 50 are, for example, silicon oxide films.

The source line BSL is patterned into a prescribed configuration before stacking the sacrificial films 40 and the insulating films 50. For example, the source line BSL is provided in a flat plate configuration in a region used to form the memory cell array MCA, and has an opening BOP through which the contact plug CC extends. Also, the source line BSL is selectively removed in a region where the hook-up region HUR3 is formed (referring to FIGS. 1 and 7).

Subsequently, sacrificial films 40a, 40b, 40c, and the insulating films 50 on the sacrificial film 40a, 40b and 40c are selectively removed so that remaining portion, which are to be replaced with the select gate SGD, are provided in the regions where the memory cell regions MCR1 and MCR2 are formed. At this time, the end portions of the sacrificial films 40a, 40b, and 40c are formed in a staircase configuration.

Figure 5:
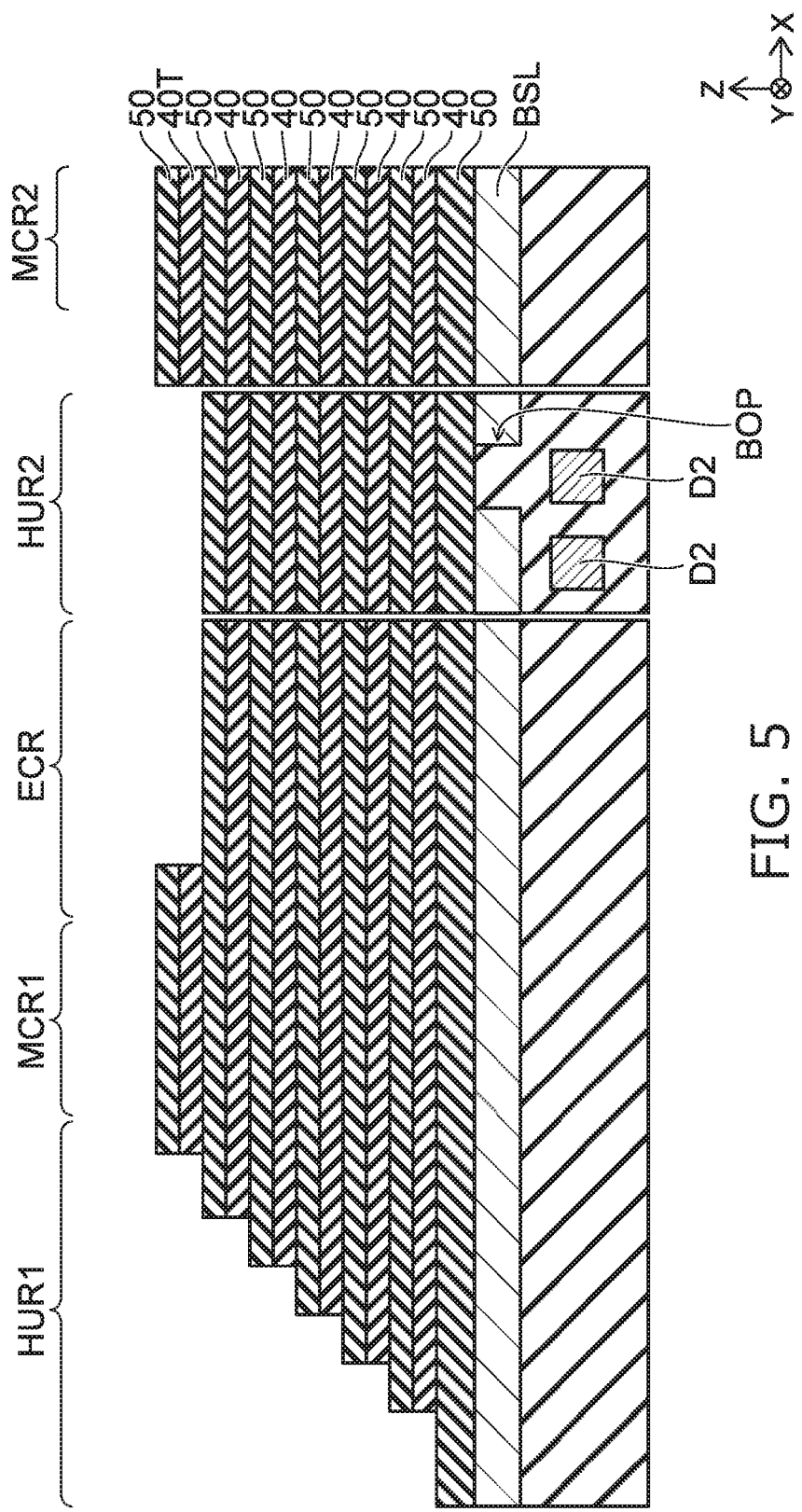

As shown in FIG. 5, the end portions of the sacrificial films 40 other than the portion to be replaced with the select gate SGD are formed in a staircase configuration. At this time, a portion of the stacked body of the sacrificial films 40 and the insulating films 50 is selectively removed, which surrounds the region that is to be the memory cell array MCA. Also, the end portions of the sacrificial films 40 on the two sides in the X-direction are formed in staircase configurations. For convenience of the illustration in FIG. 5, the number of stacks of the sacrificial films 40 is reduced; and the sacrificial films 40a, 40b, and 40c to be replaced with the select gate SGD are shown as a sacrificial film 40T.

Figure 6:
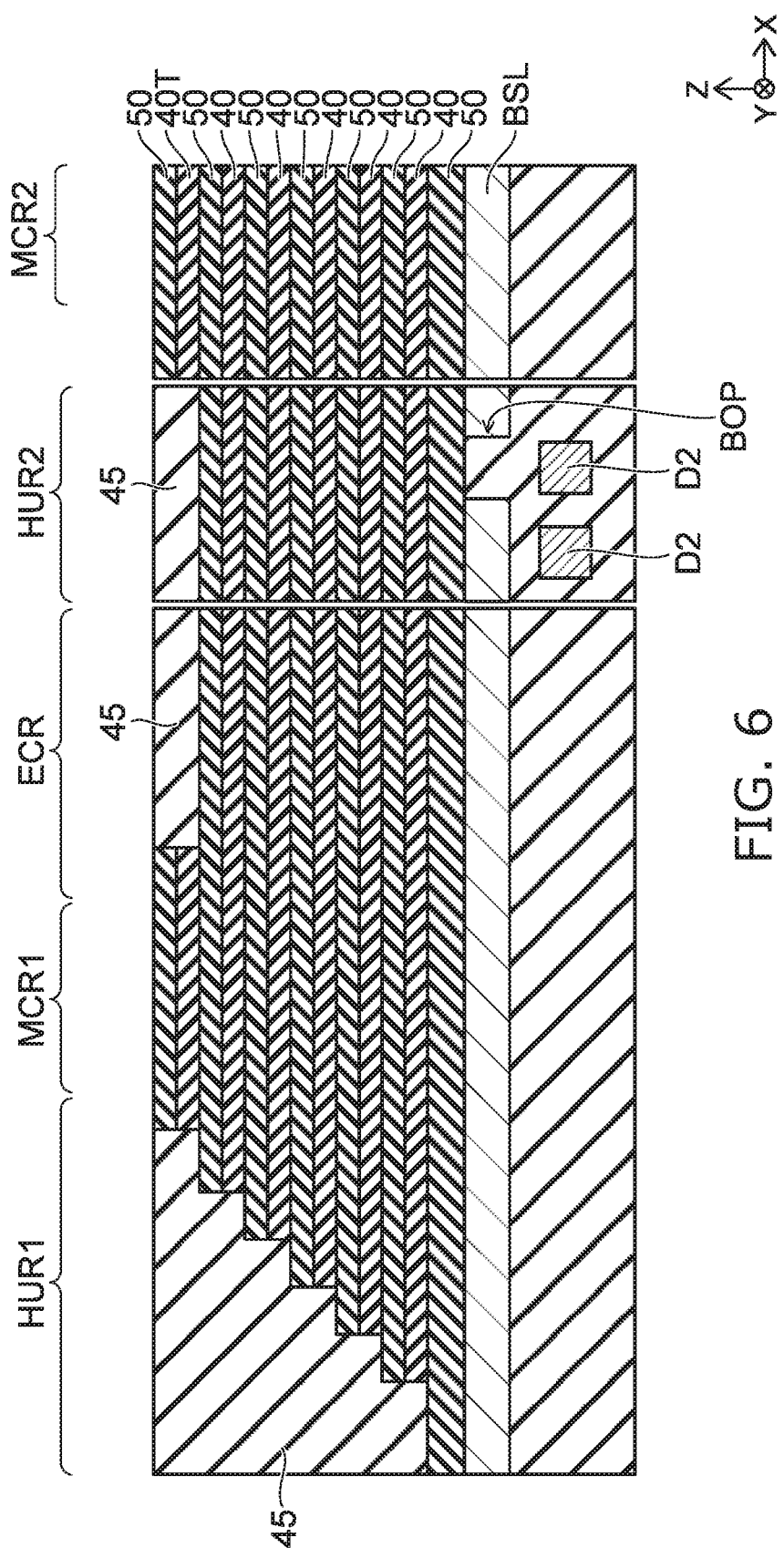

As shown in FIG. 6, an insulating film 45 is formed, which covers the end portions of the sacrificial films 40. The insulating film 45 is formed to surround the region that is to be the memory cell array MCA. Also, the insulating film 45 is filled into portions other than the sacrificial film 40T that is to be replaced with the select gate SGD. For example, the insulating film 45 is formed so that the upper surface of the insulating film 45 is positioned at substantially the same level as the upper surface of the insulating film 50 of the uppermost layer. The insulating film 45 is, for example, a silicon oxide film.

Figure 7:
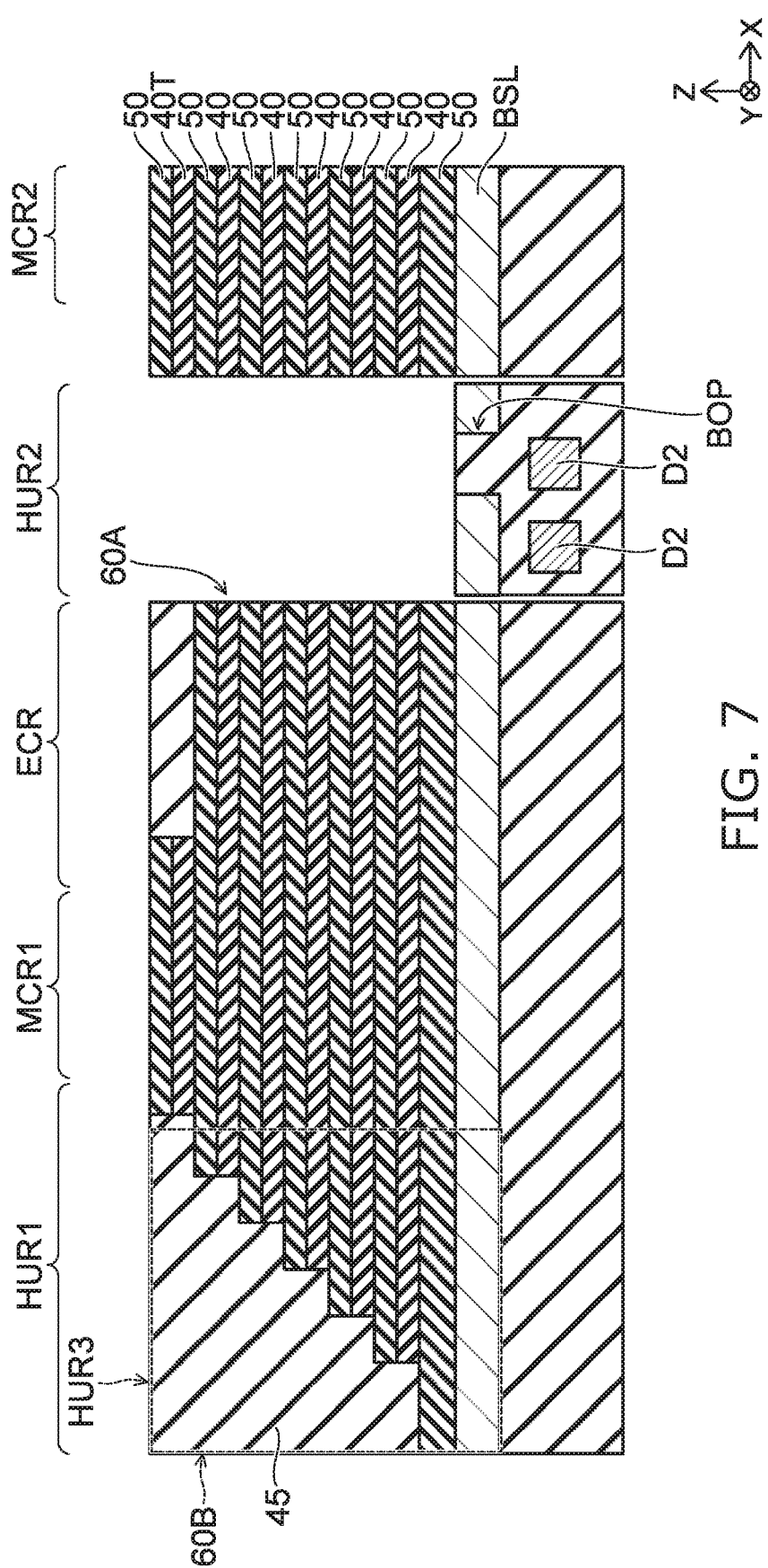

As shown in FIG. 7, the insulating films 45 and 50 and the sacrificial films 40 are selectively removed in the hook-up regions HUR2 and HUR3. For example, in the hook-up region HUR2, the source line BSL is exposed at the bottom surface of a space 60A where the insulating films 45 and 50 and the sacrificial films 40 are removed. A space 60B that is formed in the hook-up region HUR3 is formed to have a bottom surface positioned at substantially the same level as the upper surface of the source line BSL or at a lower level than the upper surface of the source line BSL.

Figure 8:
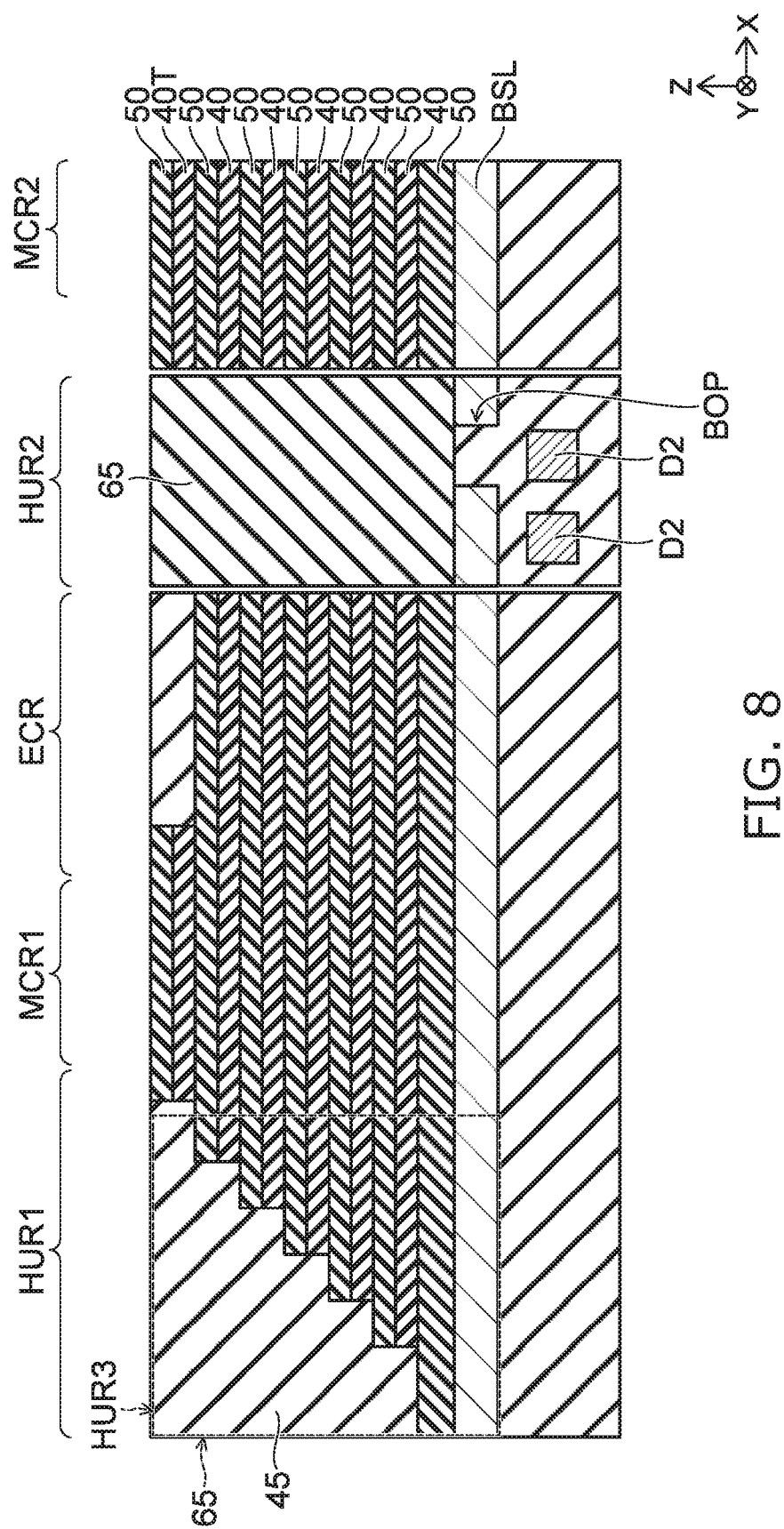

As shown in FIG. 8, an insulating body 65 is formed in the spaces 60A and 60B. For example, the insulating body 65 is formed so that the top surface of the insulating body 65 is positioned at substantially the same level as the top surface of the insulating film 50 of the uppermost layer. The insulating body 65 is, for example, silicon oxide.

Figure 9:
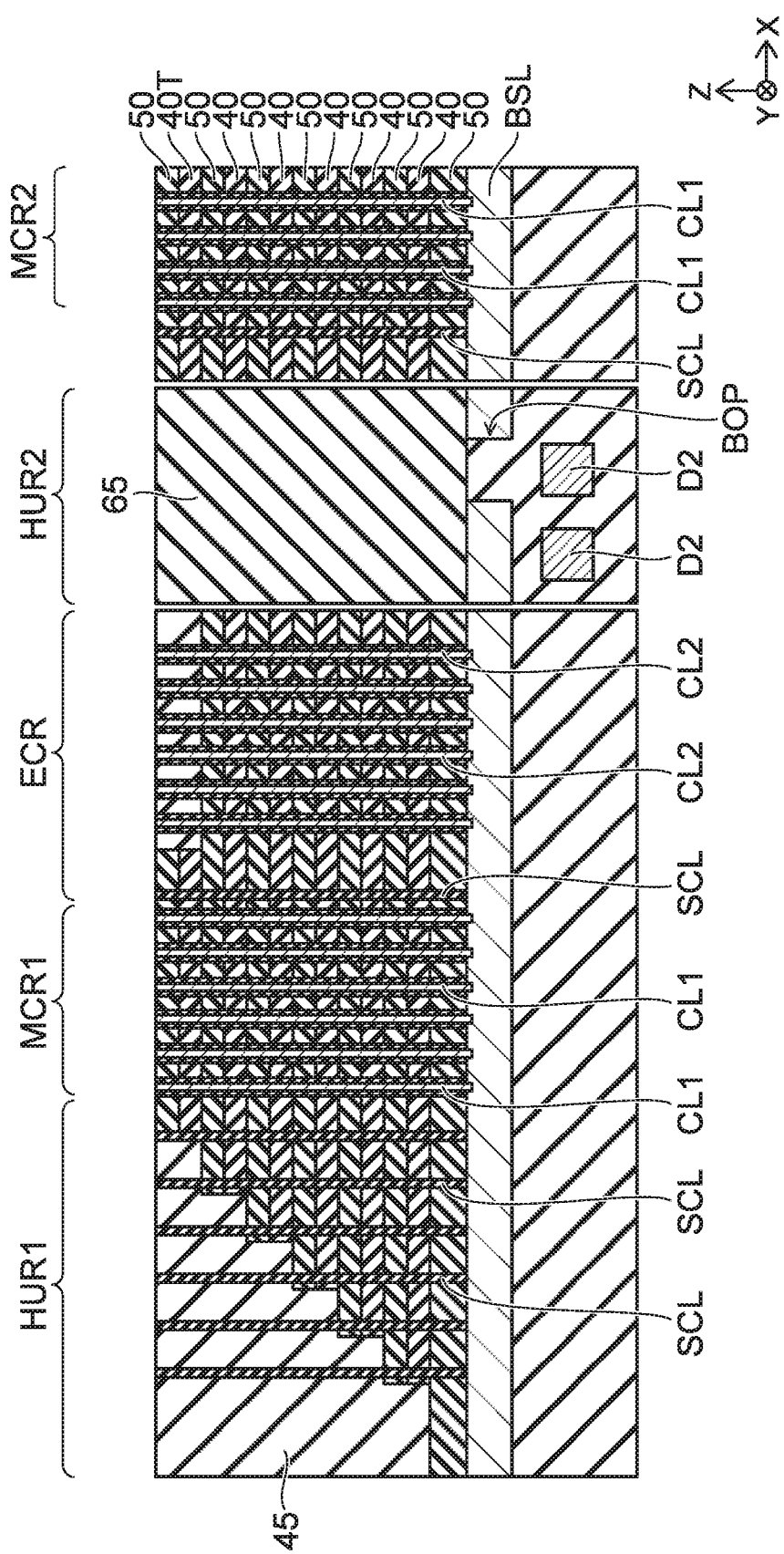

As shown in FIG. 9, columnar bodies CL1 and CL2 and the columnar support bodies SCL are formed, which have lengths from substantially the same level as the upper surface of the insulating film 50 of the uppermost layer to the source line BSL. The columnar bodies CL1 are formed in the memory cell regions MCR1 and MCR2; and the columnar bodies CL2 are formed in the connection region ECR. The columnar support bodies SCL are formed in portions of the hook-up region HUR1 and the memory cell region MCR where the columnar bodies CL1 and CL2 are not disposed. The columnar support bodies SCL is formed after or before the columnar bodies CL1 and CL2 are formed. Alternatively, the columnar support bodies SCL may be simultaneously formed with the columnar bodies CL1 and CL2.

The columnar bodies CL1 and CL2 are provided in the memory holes MH having depths from the upper surface of the insulating film 50 of the uppermost layer to the source line BSL and each include the memory film MF, the semiconductor layer 30, and the insulating core 31 (referring to FIG. 3A). For example, the columnar bodies CL1 and CL2 have the same structure.

The columnar support body SCL is provided in the support hole HR having a depth from the level of the upper surface of the insulating film 50 of the uppermost layer to the source line BSL. The columnar support body SCL includes an insulating body, e.g., silicon oxide filling the support hole HR. When the columnar support bodies are formed with the columnar bodies CL1 and CL2, the columnar support bodies have the same structure with the columnar bodies CL1 and CL2.

Figure 10:
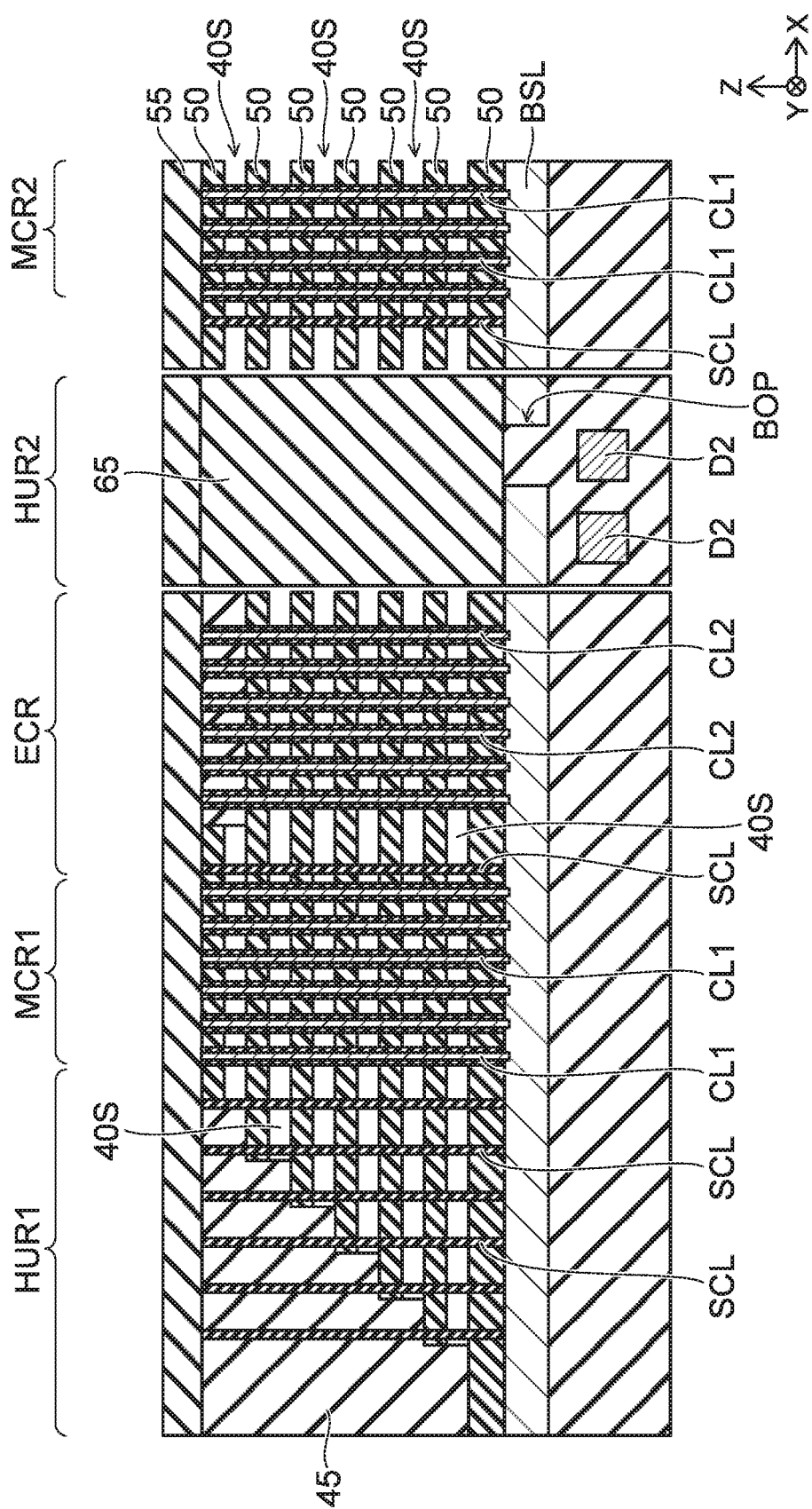

As shown in FIG. 10, an insulating film 55 is formed to cover the insulating film 45, the insulating film 50 of the uppermost layer, and the insulating body 65, and to protect the columnar bodies CL1 and CL2; subsequently, the slits ST1 and ST2 are formed (referring to FIG. 2 and FIG. 14). The slit ST2 is formed discontinuously in the X-direction so that the slit ST2 does not divide the sacrificial films 40.

Then, the sacrificial films 40 are selectively removed; and spaces 40S are formed respectively between the insulating films 50. For example, the sacrificial films 40 are selectively removed by supplying an etchant via the slits ST1 and ST2. The columnar bodies CL1 and CL2 and the columnar support bodies SCL support the insulating films 50 and maintain the space 40S between the insulating films 50.

Figure 11:
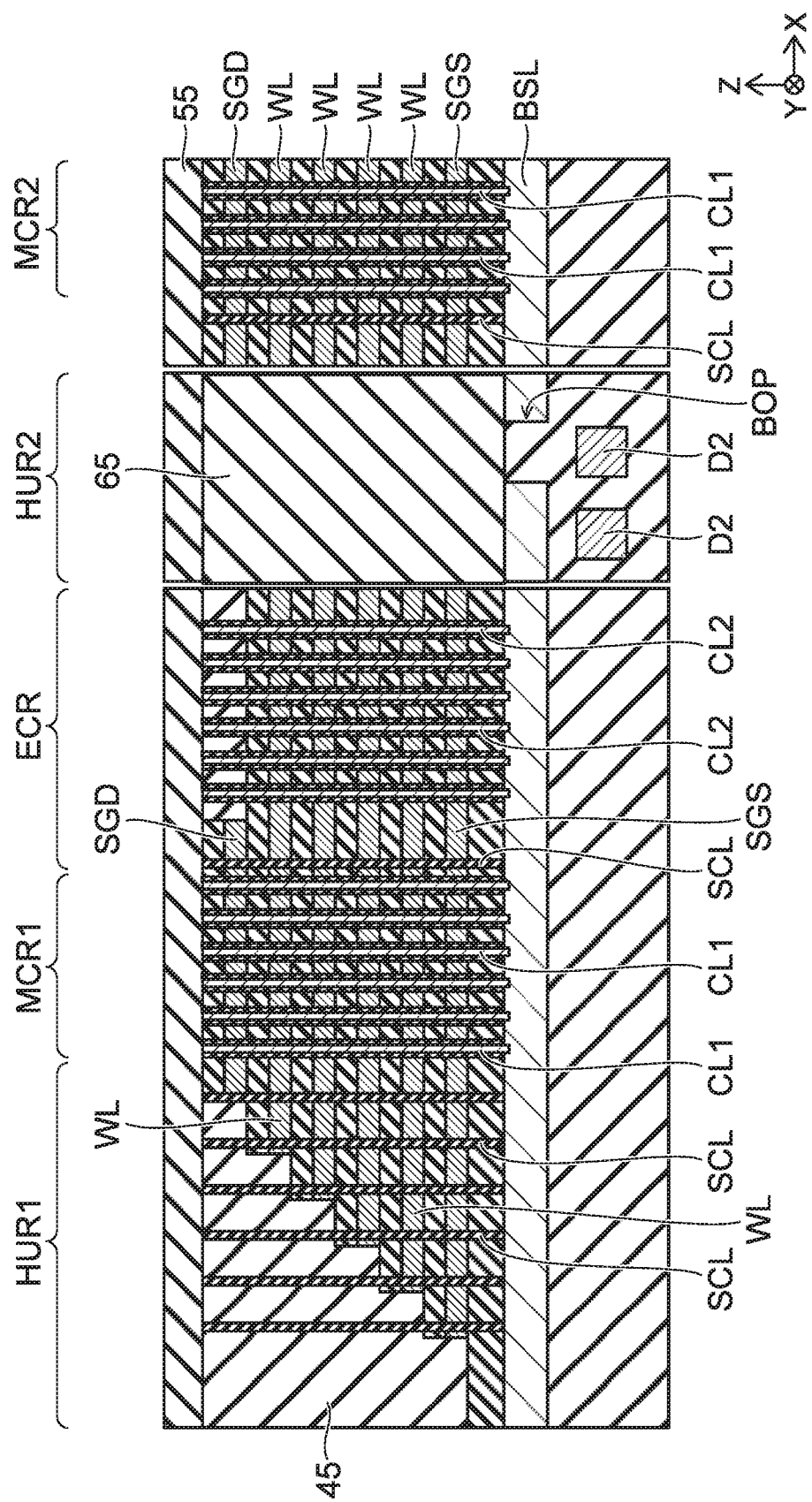

As shown in FIG. 11, the select gate SGS, the word lines WL, and the select gate SGD are formed in the spaces 40S. For example, the select gate SGS, the word lines WL, and the select gate SGD are formed by depositing a metal layer in the spaces 40S by supplying a source gas of CVD via the slits ST1 and ST2.

Figure 14:
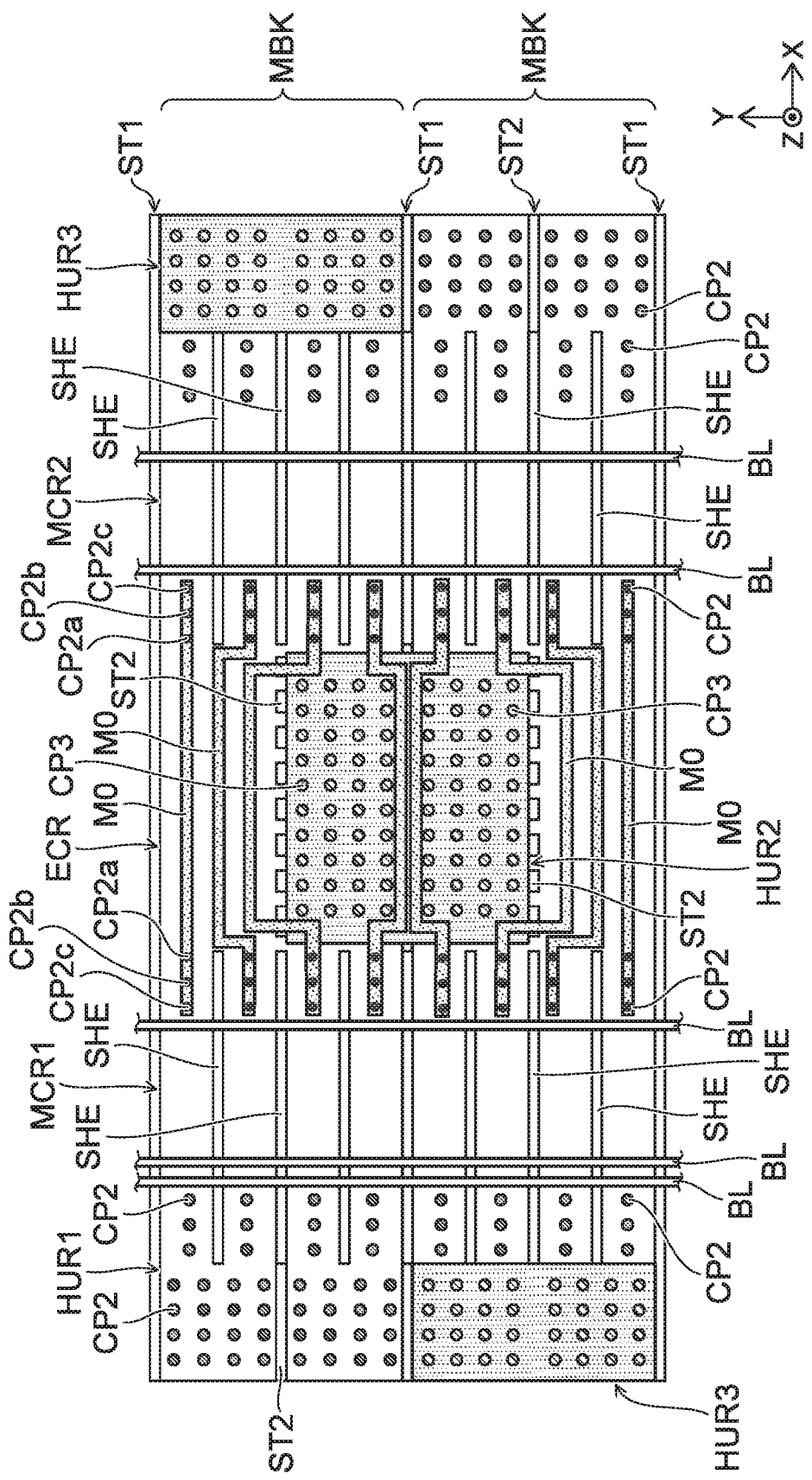
FIG. 14 is another schematic plan view showing the memory device according to the first embodiment.

Then, a slit SHE is formed to divide the select gate SGD (referring to FIG. 14). The slit SHE extends in the X-direction; and the bottom portion of the slit SHE is positioned at a higher level than the word lines WL. Further, an insulating film, e.g., a silicon oxide film is filled into the slit SHE.

Figure 12:
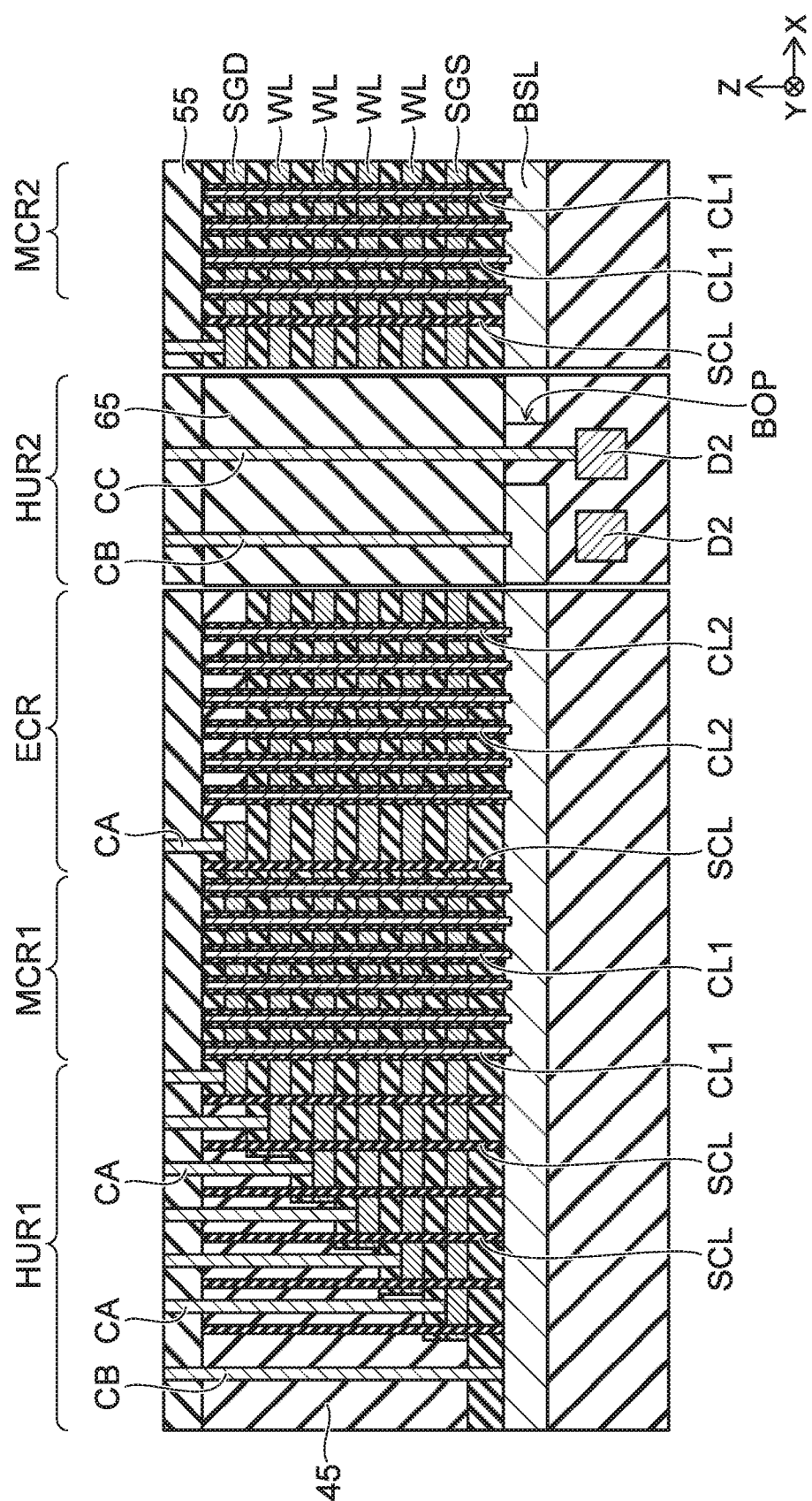

As shown in FIG. 12, the contact plugs CA, the contact plug CB, and the contact plug CC are formed such that the contact plugs CA are connected to the select gate SGS, the word lines WL, and the select gate SGD, respectively; the contact plug CB is connected to the source line BSL; and the contact plug CC is connected to the interconnection D2 of the circuit CUA.

The contact plugs CA extend through the insulating films 45 and 55 in the Z-direction and have lengths so as to respectively reach the select gate SGS, the word lines WL, and the select gate SGD from the upper surface of the insulating film 55.

The contact plugs CB are provided in each of the hook-up regions HUR1 and HUR2, and are connected to the metal layer 23 of the source line BSL (referring to FIG. 1). In the hook-up region HUR1, the contact plug CB extends in the Z-direction through the insulating films 45 and 55. In the hook-up region HUR2, the contact plug CB extends in the Z-direction through the insulating film 55 and the insulating body 65.

In the hook-up regions HUR2 and HUR3, the contact plugs CC extend in the Z-direction through the insulating body 65. In the hook-up region HUR2, the contact plug CC extends through the insulating film 55 and the insulating body 65, passes through the opening BOP of the source line BSL, and is connected to the interconnection D2. Also, in the hook-up region HUR3 (not-illustrated), the contact plug CC extends through the insulating film 55 and the insulating body 65, and is connected to the interconnection D2 disposed below (referring to FIG. 1).

Figure 13:
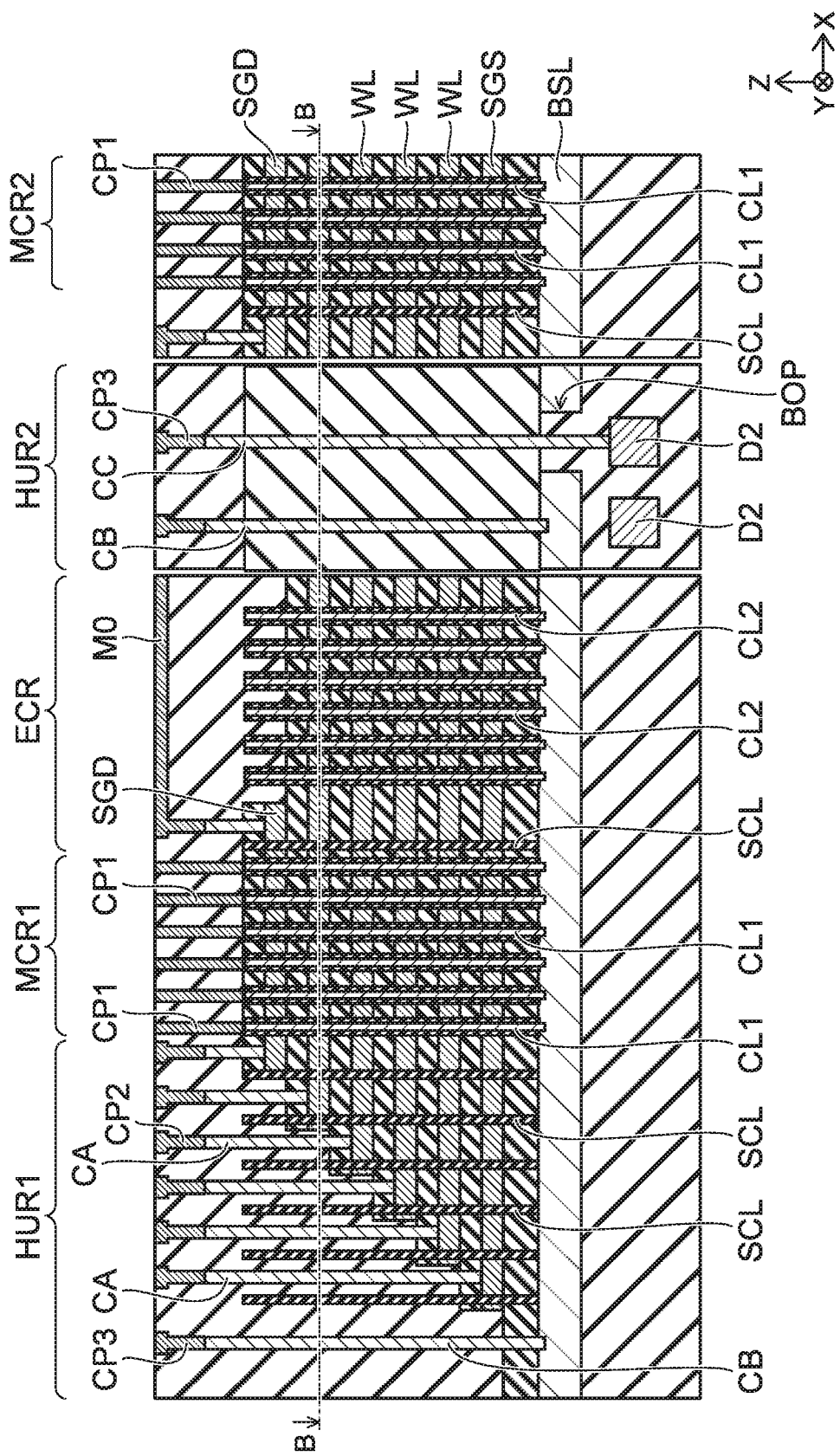

As shown in FIG. 13, the columnar bodies CL1 are connected respectively to the bit lines BL in the upper layer via connection plugs CP1 (referring to FIG. 1). The contact plugs CA each are connected to any one of the interconnections M0, M1, and M2 in the upper layer via a connection plug CP2. Also, the contact plugs CB and CC are connected respectively to the interconnections M1 and M2 in the upper layer via connection plugs CP3.

In such a case, the select gates SGD are disposed on the two sides of the connection region ECR and the hook-up regions HUR2, and are electrically connected via the interconnections M0. Thereby, the select gates SGD, which are separated with the connection region ECR and the hook-up regions HUR2 interposed, can be connected and set to the same potential. Also, the columnar bodies CL2 that are formed in the connection region ECR are not connected to any of the interconnections M0, M1, and M2 in the upper layer.

FIG. 14 is a schematic plan view showing the upper surface of the memory cell array MCA of the memory device 1 according to the first embodiment. The memory cell array MCA includes the multiple memory blocks MBK disposed to be arranged in the Y-direction. Two of the multiple memory blocks MBK are shown in FIG. 14.

The bit lines BL extend in the Y-direction, and are disposed above the memory cell region MCR1 and the memory cell region MCR2. For example, the bit lines BL are provided at the same level as the interconnections M0. The bit lines BL are not disposed above the connection region ECR and the hook-up region HUR2.

The select gate SGD which is the uppermost layer of the multiple electrode layers is provided in the memory cell regions MCR1 and MCR2 (referring to FIG. 13) and is divided by the slits SHE extending in the X-direction. An insulating film, e.g., a silicon oxide film is filled into the slits SHE.

The multiple select gates SGD are disposed to be arranged in the Y-direction in each of the memory cell regions MCR1 and MCR2. The select gates SGD each are provided to extend in the X-direction. Also, the select gates SGD are disposed at the two sides in the X-direction of the connection region ECR and the two sides in the X-direction of the hook-up region HUR2. Also, the two select gates SGD disposed with the connection region ECR interposed and the two select gates SGD disposed with the hook-up region HUR2 interposed each are electrically connected via the interconnections M0.

For example, the select gate SGD has a three-layer structure and includes the select gates SGD1, SGD2, and SGD3 (referring to FIG. 3A). Also, connection plugs CP2a, CP2b, and CP2c are provided, which are connected respectively to the select gates SGD1, SGD2, and SGD3.

For example, the interconnections M0 connect the connection plugs CP2a, CP2b, and CP2c positioned on the one side in the X-direction of the connection region ECR to the connection plugs CP2a, CP2b, and CP2c positioned on the other side in the X-direction. Thereby, the select gates SGD can be set to the same potential, which have the three-layer structures disposed on the two sides of the connection region ECR. The select gates SGD that are disposed on the two sides of the hook-up region HUR2 similarly are electrically connected via the interconnections M0. Also, the interconnections M0 are disposed to avoid the region above the connection plugs CP3 provided in the hook-up region HUR2.

Figure 15:
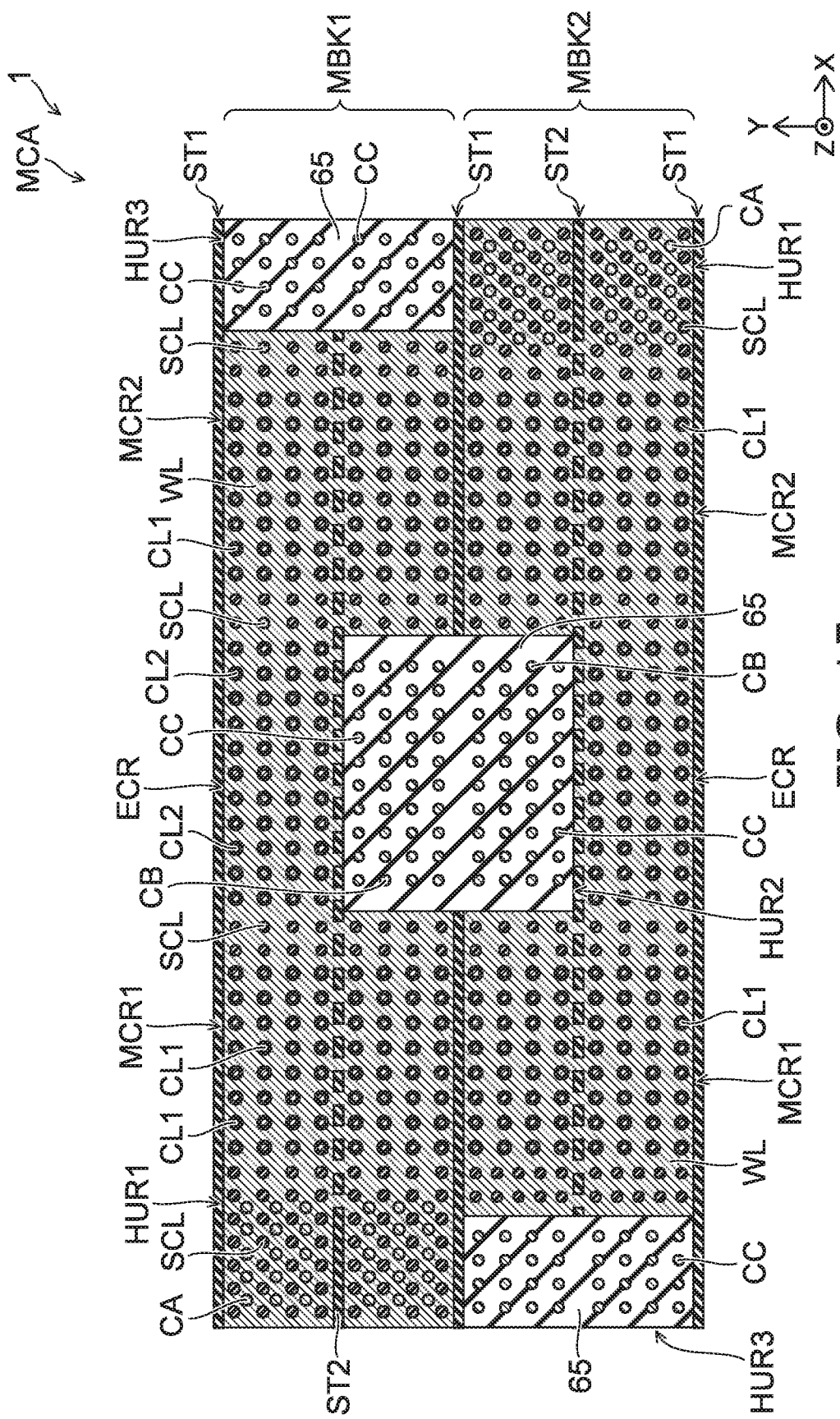
FIG. 15 is another schematic cross-sectional view showing the memory device according to the first embodiment.

FIG. 15 is a schematic cross-sectional view showing the memory cell array MCA of the memory device 1 according to the first embodiment. FIG. 15 is a schematic view showing a cross section along line B-B shown in FIG. 13.

As shown in FIG. 15, the columnar bodies CL1 are disposed in the memory cell regions MCR1 and MCR2; and the columnar bodies CL2 are disposed in the connection region ECR. The columnar support bodies SCL are disposed in the hook-up region HUR1 and the region where the end of the select gate SGD is formed in a staircase configuration.

For example, although the columnar bodies CL1 and the columnar bodies CL2 have the same structure, the semiconductor layers 30 of the columnar bodies CL1 are electrically connected to the bit lines BL; and the semiconductor layers 30 of the columnar bodies CL2 are not connected to the bit lines BL. Therefore, memory cells MC act at the portions where the columnar bodies CL1 cross the word lines WL, and memory cells MC do not act at the portions where the columnar bodies CL2 cross the word lines WL.

The contact plugs CB and CC that extend in the Z-direction through the insulating body 65 are provided in the hook-up regions HUR2 and HUR3. In contrast, when the insulating body 65 is not disposed in the hook-up region HUR2, the contact plugs CB and CC extend through the word lines WL and the select gate SGS. Accordingly, it is necessary to dispose a spacer insulating film around the contact plug to electrically insulate the contact plugs from the word lines WL and the select gate SGS.

For example, the region where the contact plugs are disposed has an area that combines at least the openings of the contact holes in which the contact plugs are provided, and the space between the contact holes. In the case where the spacer insulating film is disposed around the contact plugs, the contact holes are formed to have an opening surface area such that the contact plugs and the spacer insulating film can be disposed. Then, to ensure a prescribed insulation breakdown voltage between the word lines and the contact plugs, the spacer insulating film becomes thick; and the opening surface area of the contact holes becomes larger. Therefore, in the case where many contact plugs are disposed, the region in which the contact plugs are disposed may occupy the surface area of the memory cell array with a proportion not to be ignored.

In the memory device 1 according to the embodiment, it is unnecessary to dispose the spacer insulating film because the contact plugs CB and CC are disposed to extend through the insulating body 65. Therefore, the surface area of the hook-up region HUR2 can be reduced; and the surface area of the memory cell regions MCR1 and MCR2 can be increased. As a result, it is possible to increase the memory capacity of the memory device 1. The surface area can be reduced similarly in the hook-up region HUR3 as well.

Second Embodiment

Figure 16:
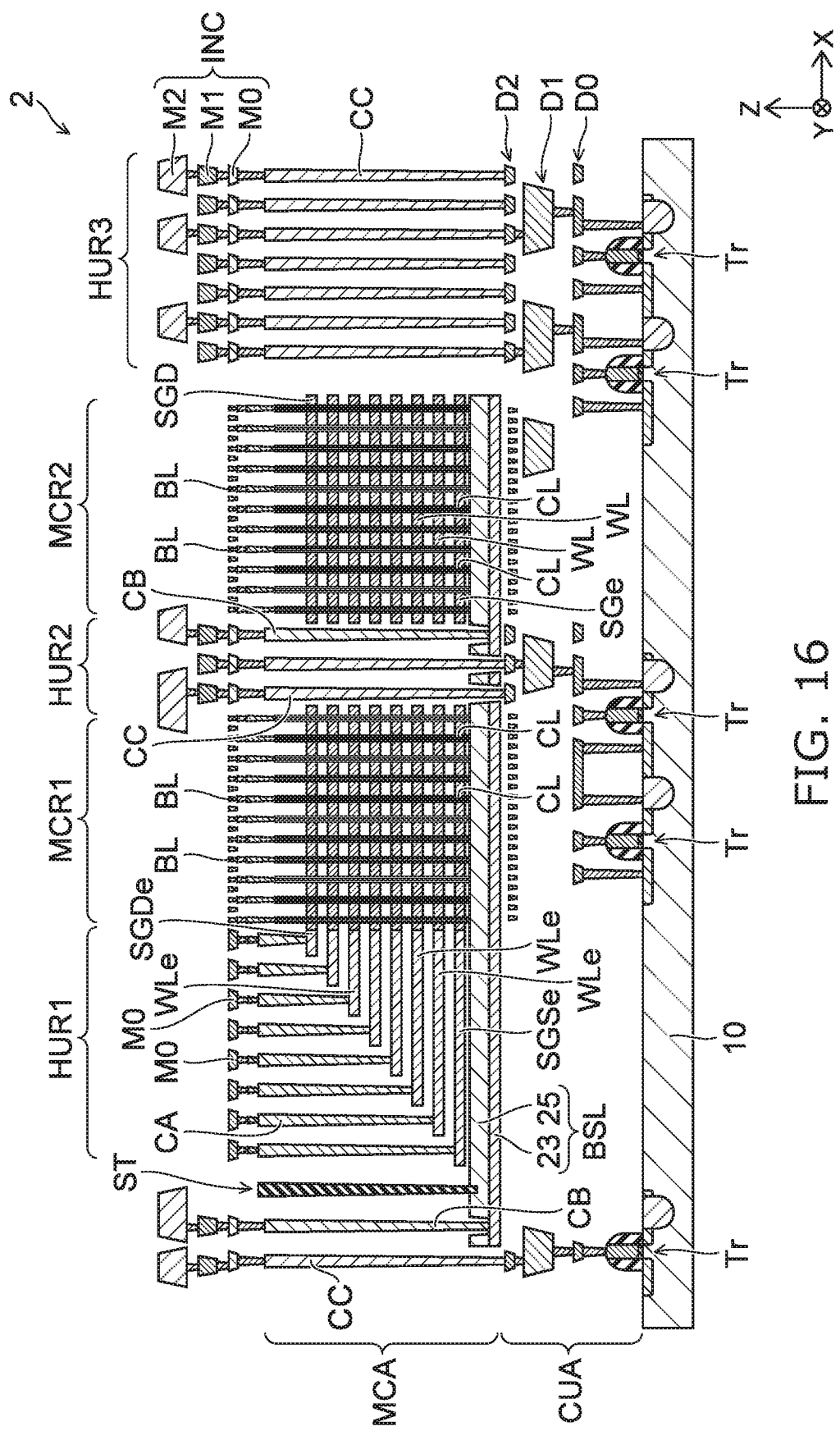
FIG. 16 is a schematic cross-sectional view showing a memory device according to a second embodiment.

FIG. 16 is a schematic cross-sectional view showing a memory device 2 according to a second embodiment. The memory device 2 includes the memory cell array MCA that is provided above the substrate 10, and the circuit CUA that is disposed between the substrate 10 and the memory cell array MCA. The memory cell array MCA includes the memory cell regions MCR1 and MCR2 and the hook-up regions HUR1, HUR2 and HUR3.

The hook-up regions HUR2 and HUR3 include the insulating body 65 that is thicker than the stacked thickness of the stacked body including the select gate SGS, the word lines WL, and the select gate SGD (referring to FIG. 8). The hook-up regions HUR2 and HUR3 include the multiple contact plugs CB and CC that extend in the Z-direction through the insulating body 65.

Further, in the memory device 2, the end portions of each of the word lines WL and the select gates SGS and SGD positioned in the hook-up region HUR1 include a material that is different from the portions provided in the memory cell region MCR.

For example, the word line WL includes a first portion that includes a metal provided in the memory cell region MCR, and a second portion that includes polysilicon provided in the hook-up region HUR1. This is similar for the select gates SGS and SGD as well.

Figure 17:
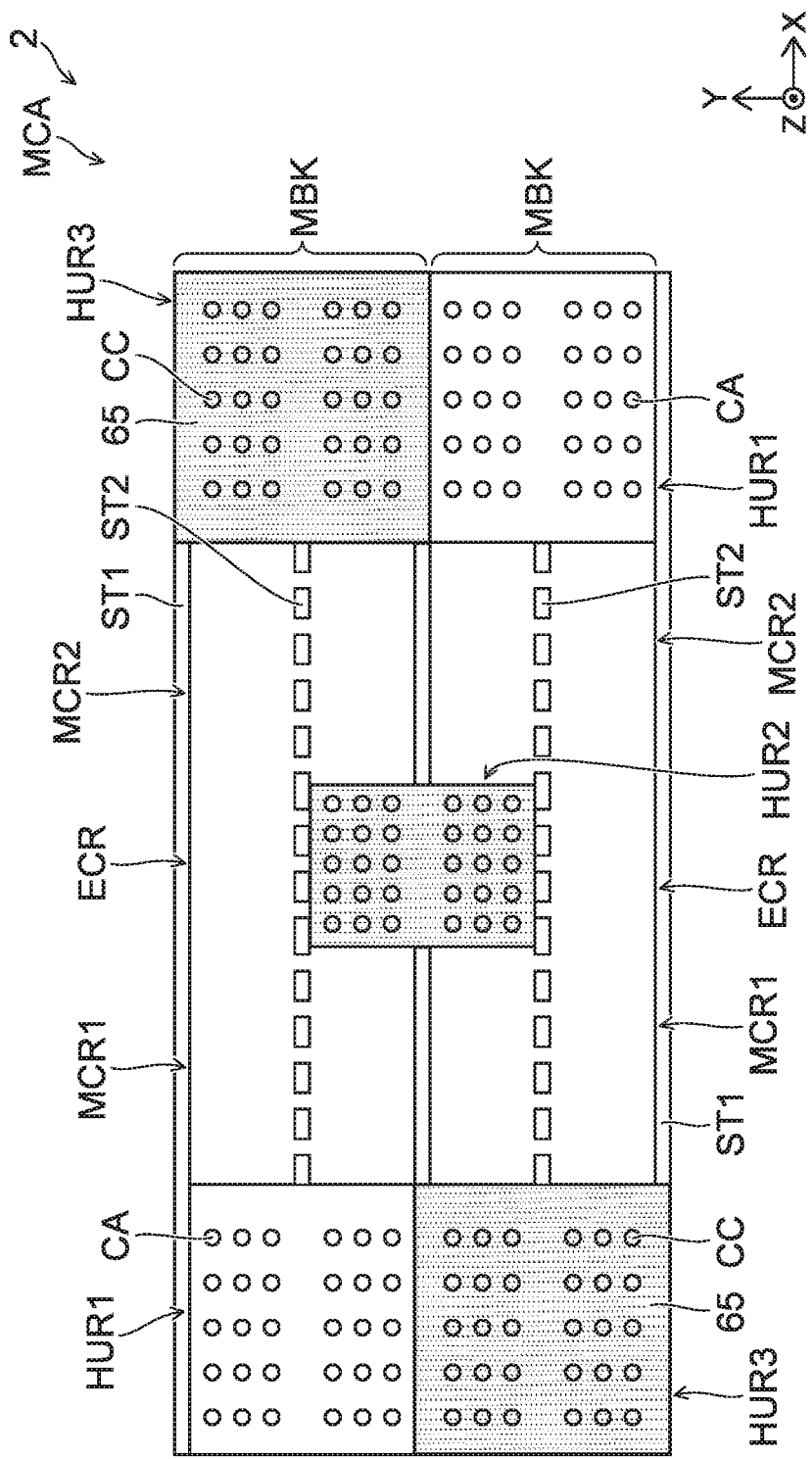
FIG. 17 is a schematic plan view showing the memory device according to the second embodiment.

FIG. 17 is a schematic plan view showing the configuration of the memory cell array MCA of the memory device 2. The memory cell array MCA includes the multiple memory blocks MBK arranged in the Y-direction. The memory blocks MBK each include the memory cell regions MCR1 and MCR2, the connection region ECR, and the hook-up regions HUR1, HUR2 and HUR3.

The hook-up regions HUR1 and HUR3 are disposed respectively at the two ends of the memory block MBK. The hook-up region HUR2 is disposed to be surrounded with the memory cell regions MCR1 and MCR2 and the connection regions ECR.

In the example, the slit ST1 is provided between the memory cell regions MCR1 adjacent to each other in the Y-direction, between the memory cell regions MCR2 adjacent to each other in the Y-direction, and between the connection regions ECR adjacent to each other in the Y-direction. The slit ST1 is not provided between the hook-up region HUR1 and the hook-up region HUR3.

Also, for example, the slit ST2 is provided at the centers of the memory cell regions MCR1 and MC2 and between the connection region ECR and the hook-up region HUR2 and is disposed discontinuously along the extension direction of the word line WL (the X-direction). The slit ST2 is not provided in the hook-up region HUR1.

In the manufacturing processes of the memory device 2, for example, conductive polysilicon films are used as the sacrificial films 40. For example, the sacrificial films 40 are selectively removed by an etchant supplied via the slits ST1 and ST2 in the process shown in FIG. 10.

In the manufacturing processes according to the embodiment, the slit ST1 is not provided between the region used to form the hook-up region HUR1 and the region used to form the hook-up region HUR3; and the slit ST2 is not provided in the region used to form the hook-up region HUR1. Therefore, in the region that is to be the hook-up region HUR1, the sacrificial films 40 are not removed; and the space 40S is not formed between the insulating films 50. Accordingly, only the portions of the sacrificial films 40 formed in the region that is to be the memory cell region MCR are replaced with metal layers; and a portion of the sacrificial films 40 remains in the hook-up region HUR1. As a result, the word lines WL and the select gates SGS and SGD are formed so that the material of the portions provided in the memory cell region MCR is different from the material of the end portions provided in the hook-up region HUR1.

In the embodiment, the columnar support bodies SCL are not disposed in the hook-up region HUR1 because the space 40S is not provided in the region that is to be the hook-up region HUR1. Thereby, the surface area of the hook-up region HUR1 can be reduced. Also, it is possible to reduce the surface area of the hook-up region HUR3 as well because the multiple contact plugs CC are provided to extend through the insulating body 65 in the hook-up region HUR3. As a result, the surface area of the hook-up regions HUR provided at the two ends of the memory block MBK can be reduced; and the surface area of the memory cell region MCR can be increased. Thereby, the memory capacity of the memory device 2 can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A memory device, comprising:
a memory region including a plurality of electrode layers and semiconductor layers, the plurality of electrode layers being stacked in a first direction, and the first semiconductor layers extending in the first direction through the plurality of electrode layers;
a connection region surrounded with the memory region, the connection region including an insulating body and a plurality of contact plugs, the insulating body having a thickness in the first direction thicker than a stacked width in the first direction of the plurality of electrode layers, and the plurality of contact plugs extending in the first direction through the insulating body;
an interconnection layer including, a first interconnection, a plurality of second interconnections, and a plurality of third interconnections, the plurality of second, interconnections being electrically connected respectively to the plurality of electrode layers, the plurality of third interconnections being electrically connected respectively to the first semiconductor layers; and
a circuit electrically connected to the first interconnection included in the interconnection layer, the circuit being electrically connected via a first contact plug of the plurality of contact plugs to the first interconnection,
the plurality of electrode layers and the insulating body being positioned between the circuit and the interconnection layer in the first direction,
the plurality of electrode layers including a plurality of first electrode layers stacked in the first direction, the plurality of first electrode layers each including a first portion, a second portion, and a third portion,
the first portion extending in a second direction crossing the first direction, the first and second portions being arranged in a third direction crossing the first direction and the second direction, the first and third portions being arranged in the third direction, the second and third portions being arranged in the second direction,
the insulating body being positioned between the second portion and the third portion, the insulating body and the first portion being arranged in the third direction,
the second portion, the insulating body, and the third portion being arranged along the first portion in the second direction, the second and third portions being electrically connected to the first portion.

2. The memory device according to claim 1, further comprising:
a conductive layer provided between the circuit and the plurality of electrode layers, the conductive layer being electrically connected to the semiconductor layers,
the insulating body being positioned between the interconnection layer and the conductive layer in the first direction.

3. The memory device according to claim 2, wherein the first contact plug of the plurality of contact plugs extends in the first direction through the conductive layer.

4. The memory device according to claim 3, wherein the interconnection layer further includes a fourth interconnection, and
the plurality of contact plugs further includes a second contact plug electrically connecting the conductive layer and the fourth interconnection.

5. The memory device according to claim 1, wherein the plurality of first electrode layers each includes first and second connection portions, the first connection portion electrically connecting the first portion and the second portion, and the second connection portion electrically connecting the first portion and the third portion.

6. The memory device according to claim 1, wherein the plurality of third interconnections extend in the third direction so as not to cross the insulating body.

7. The memory device according to claim 6, wherein the memory region further includes second semiconductor layers extending through the plurality of first electrode layers, the second semiconductor layers being electrically isolated from the interconnection layer;
the plurality of electrode layers further includes a second electrode layer, a third electrode layer, a fourth electrode layer, and a fifth electrode layer, the second and third electrode layers being stacked respectively on the first portions of the first electrode layers in the first direction, the fourth electrode layer being stacked on the second portions of the first electrode layers in the first direction, the fifth electrode layer being stacked on the third portions of the first electrode layers in the first direction, the first semiconductor layers extending through the second to fifth electrode layers, respectively, and being electrically connecting to the plurality of third interconnections, the second semiconductor layers being positioned between the second electrode layer and the third electrode layer; and
the interconnection layer further includes a fifth interconnection and a sixth interconnection, the fifth interconnection electrically connecting the second electrode layer and the third electrode layer, the sixth interconnection electrically connecting the fourth electrode layer and the fifth electrode layer.

8. The memory device according to claim 7, wherein the fifth and sixth interconnections are provided so as not to cross the plurality of third interconnections.

9. A memory device, comprising:
a first memory part including a plurality of first electrode layers and a first semiconductor layer, the plurality of first electrode layers being stacked in a first direction, the first semiconductor layer extending in the first direction through the plurality of first electrode layers,
the first memory part including a first memory region and a first connection region, the first memory region and the first connection region being arranged in a second direction crossing the first direction,
the first memory region including the first semiconductor layer,
the first connection region including ends of the plurality of first electrode layers, the ends of the plurality of first electrode layers being provided in a staircase configuration, the first connection region including a plurality of first contact plugs connected respectively to the ends of the plurality of first electrode layers;
a second memory part including a plurality of second electrode layers and a second semiconductor layer, the plurality of second electrode layers being stacked in the first direction,
the second semiconductor layer extending in the first direction through the plurality of second electrode layers,
the first memory part and the second memory part being arranged in a third direction crossing the first and second directions,
the second memory part including a second memory region and a second connection region, the second memory region and the second connection region being arranged in the second direction,
the second memory region including the second semiconductor layer,
the second connection region including ends of the plurality of second electrode layers, the ends of the plurality of second electrode layers being provided in a staircase configuration, the second connection region including a plurality of second contact plugs connected respectively to the ends of the plurality of second electrode layers; and
a first additional connection part provided between the first connection region and the second connection region, the first additional connection part including a first insulating body and a plurality of first additional contact plugs, the first insulating body having a thickness in the first direction thicker than a stacked width in the first direction of the first electrode layers and a stacked width in the first direction of the second electrode layers, the plurality of first additional contact plugs extending in the first direction through the first insulating body, the plurality of first additional contact plugs being arranged in the second and third directions, the first connection region, the first additional connection part, and the second connection region being arranged in order along the third direction.

10. The memory device according to claim 9, further comprising a third memory part provided between the first memory part and the second memory part, the third memory part including a plurality of third electrode layers and a third semiconductor layer, the plurality of third electrode layers being stacked in the first direction, the third semiconductor layer extending in the first direction through the plurality of third electrode layers, the third memory part and the first additional connection part being arranged in the second direction.

11. The memory device according to claim 10, wherein the third memory part includes a third memory region and a third connection region, the third memory region including the third semiconductor layer, the third connection region including ends of the plurality of third electrode layers, the ends of the plurality of third electrode layers being provided in a staircase configuration, the third connection region including a plurality of third contact plugs connected respectively to the ends of the plurality of third electrode layers, the third connection region, the third memory region, and the first additional connection part being arranged in the second direction.

12. The memory device according to claim 10, further comprising:

a second additional connection part provided between the first memory part and the third memory part, the second additional connection portion including a second insulating body and a plurality of second additional contact plugs, the second insulating, body having a thickness in the first direction thicker than a stacked width in the first direction of the third electrode layers, the plurality of second additional contact plugs extending in the first direction through the second insulating body, wherein the third memory region of the third memory part includes first to third sub-regions, the first and second sub-regions being arranged in the third direction with a first slit interposed, the first and third sub-regions being arranged in the third direction with a second slit interposed, the first slit and the second slit extending discontinuously in the second direction;

the second additional connection part being positioned between the second sub-region and the third sub-region;

the second sub-region, the second additional connection part, and the third sub-region being arranged along the first sub-region in the second direction.

13. The memory device according to claim 12, wherein the plurality of third electrode layers of the third memory part each includes first to third portions that correspond to the first to third sub-regions, the first to third portions being electrically connected through discontinuous portions not divided by the first slit and the second slit.

14. The memory device according to claim 10, further comprising:

an interconnection layer including a plurality of first interconnections and a second interconnection, the plurality of first interconnections being electrically connected respectively to the plurality of first electrode layers and the plurality of second electrode layers via the first contact plugs and the second contact plugs; and a circuit electrically connected to the second interconnection via one of the plurality of first additional contact plugs, the plurality of first electrode layers, the plurality of second electrode layers, and the plurality of third electrode layers being positioned between the circuit and the interconnection layer in the first direction.

15. The memory device according to claim 14, further comprising a conductive layer provided between the circuit and the plurality of first electrode layers in the first direction, between the circuit and the plurality of second electrode layers in the first direction, and between the circuit and the plurality of third electrode layers in the first direction, the conductive layer being electrically connected to the first to third semiconductor layers in the first memory region, the second memory region, and the third memory region.

16. The memory device according to claim 9, wherein the plurality of first electrode layers each include a first portion and a second portion, the first semiconductor layer extending through the plurality of first electrode layers being positioned in the first portion, the second portion being positioned at an end of one of the plurality of first electrode layers and connected to one of the plurality of first contact plugs, and a material of the first portion is different from a material of the second portion.

17. The memory device according to claim 16, wherein the plurality of second electrode layers each include a third portion and a fourth portion, the second semiconductor layer extending through the plurality of second electrode layers being positioned in the third portion, the fourth portion being positioned at an end of one of the plurality of second electrode layers and connected to one of the plurality of the second contact plugs, the third portion includes a material same as the material of the first portion, and the fourth portion includes a material same as the material of the second portion.

18. The memory device according to claim 17, wherein the first portion and the third portion include a metal, and the second portion and the fourth portion include polysilicon.

* * * * *